United States Patent [19]
Jeffery et al.

[11] Patent Number: 5,023,479
[45] Date of Patent: Jun. 11, 1991

[54] LOW POWER OUTPUT GATE

[75] Inventors: Philip A. Jeffery; Bor-Yuan Hwang, both of Tempe, Ariz.

[73] Assignee: Motorola, Inc., Schaumburg, Ill.

[21] Appl. No.: 560,920

[22] Filed: Jul. 31, 1990

[51] Int. Cl.[5] .......................................... H03K 19/02
[52] U.S. Cl. ................................... 307/446; 307/455; 307/570
[58] Field of Search ........................ 307/446, 455, 570

[56] References Cited

U.S. PATENT DOCUMENTS

| | | | |
|---|---|---|---|
| 4,490,630 | 12/1984 | Freeman | 307/455 |
| 4,806,799 | 2/1989 | Pelley et al. | 307/455 |
| 4,835,455 | 5/1989 | Coddington et al. | 307/455 |
| 4,902,915 | 2/1990 | Tran | 307/446 |
| 4,945,265 | 7/1990 | Estrada | 307/455 |

Primary Examiner—David Hudspeth
Assistant Examiner—Andrew Sanders
Attorney, Agent, or Firm—Michael D. Bingham; Bradley J. Botsch

[57] ABSTRACT

A low power BiMOS output gate includes an input circuit for passing current through its first and second outputs in response to logic states occurring on first and second input signals which are respectively applied at first and second inputs of the input circuit. A field-effect transistor has first and second electrodes and a control electrode, the control electrode is coupled to the first output of the input circuit, the first electrode is coupled to the second output of the input circuit, and the second electrode is coupled to a first supply voltage terminal. A first resistor is coupled across the second and control electrodes of the field-effect transistor while a second resistor is coupled across the first and second electrodes of the field-effect transistor such that when the first input signal is in a first logic state, the voltage drop occurring across the first resistor will render the field-effect transistor operative wherein the effective resistance of the second resistor is decreased. Also, an output circuit is coupled to the second output of the input circuit for providing an output logic signal at an output terminal of the BiMOS output gate.

12 Claims, 1 Drawing Sheet

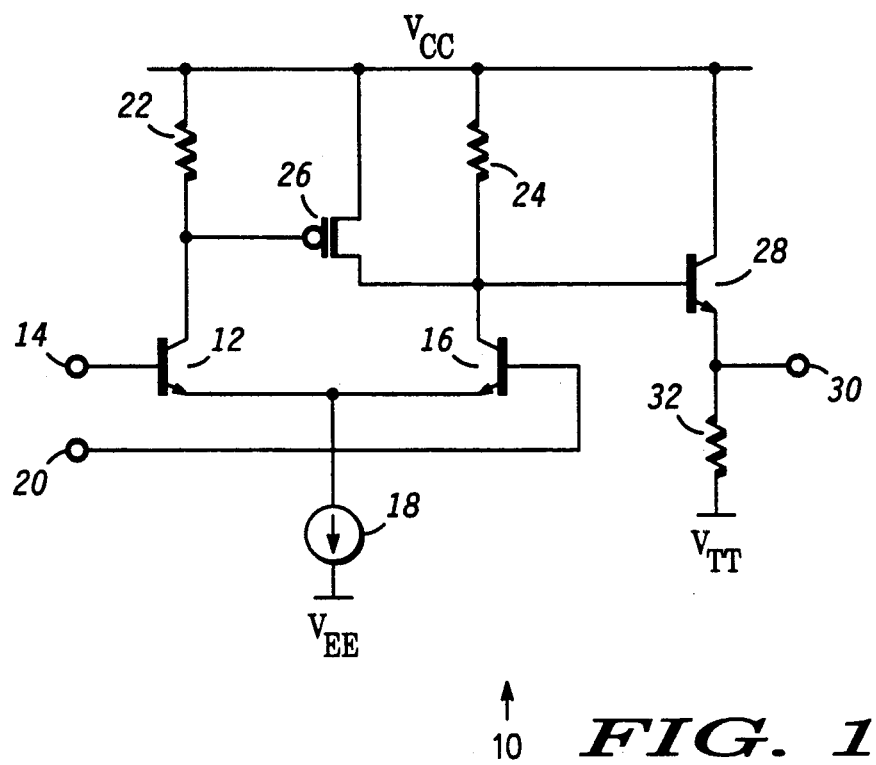
FIG. 1
FIG. 2
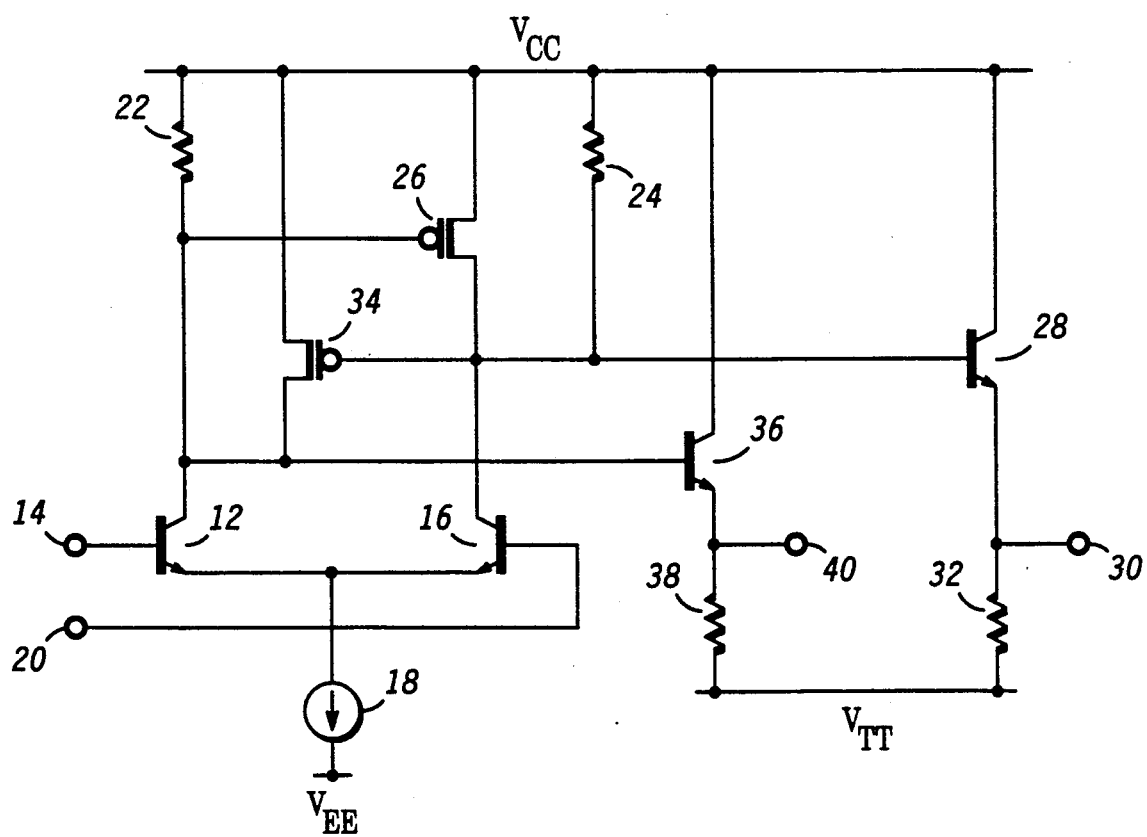

5,023,479

1

LOW POWER OUTPUT GATE

BACKGROUND OF THE INVENTION

This invention relates to ECL circuits and, in particular, to a low power ECL output gate.

A typical ECL output gate consists of a first and a second transistor which are differentially coupled such that their emitters are connected together and then coupled to a first supply voltage terminal by a current source. The bases of the first and second transistors are coupled to differential inputs at which a differential signal is typically applied thereto whereby the non-inverting signal is applied to the base of the first transistor while the inverting signal is applied to the base of the second transistor. The collectors of the first and second transistors are coupled to a second supply voltage terminal by first and second resistors, respectively. Further, the collector of the second transistor is coupled to the base of a third transistor, such that the third transistor is used to drive signals of typical ECL levels.

The aforedescribed configuration typically maintains a small value for the second resistor so that an adequate logic high voltage level ($V_{OH}$) can be achieved when a logic high occurs at the base of the first transistor. However, when a logic low occurs at the base of the first transistor, the second resistor must provide an adequate voltage drop thereacross in order to achieve an adequate logic low voltage level ($V_{OL}$). Therefore, since the second resistor is maintained small for adequate $V_{OH}$ levels, the current level provided by the current source must be made large so as to provide adequate $V_{OL}$ levels. Therefore, typical ECL output gates require a large amount of current for biasing which consequently forces the output gate to dissipate a large amount of power.

Hence, a need exists for an ECL output gate having lower power dissipation while still maintaining proper output voltage logic levels ($V_{OL}$ and $V_{OH}$).

Accordingly, it is an object of the present invention to provide an improved ECL output gate.

Another object of the present invention is to provide an improved ECL output gate having reduced power dissipation.

Still another object of the present invention is to provide an improved ECL output gate having reduced power dissipation while still maintaining proper output voltage logic levels.

Yet another object of the present invention is to provide a circuit to vary the resistance of a resistor.

In carrying out the above and other object of the present invention, there is provided a BiMOS output gate comprising an input circuit responsive to logic input signals supplied to first and second inputs for providing output logic signals at first and second outputs; a field effect transistor having first and second electrodes and a control electrode, the control electrode being coupled to the first output of the input circuit, the first electrode being coupled to the second output of the input circuit, and the second electrode being coupled to a first supply voltage terminal; a first resistor coupled across the second and control electrodes of the field-effect transistor; a second resistor across the first and second electrodes of the field-effect transistor such that when the logic input signal applied to the first input of the input circuit is in a first logic state, the voltage drop occurring across the first resistor renders the field-effect transistor operative wherein the

2 effective resistance of the second resistor is decreased; and an output circuit coupled to the second output of the input circuit for providing an output logic signal at an output terminal of the BiMOS output gate.

The above and other objects, features and advantages of the present invention will be better understood from the following detailed description taken in conjunction with the accompanying drawings.

BRIEF DESCRIPTION OF THE DRAWINGS

FIG. 1 is a detailed schematic diagram illustrating a first embodiment of the output gate of the present invention.

FIG. 2 is a detailed schematic diagram illustrating a second embodiment of the output gate of the present invention.

DETAILED DESCRIPTION OF THE INVENTION

Referring to FIG. 1, a detailed schematic diagram of a first embodiment of output gate 10 of the present invention is shown comprising transistor 12 having a base coupled to terminal 14 and an emitter coupled to the emitter of transistor 16. The emitters of transistor 12 and 16 are coupled by current source 18 to a first supply voltage terminal at which the operating potential $V_{EE}$ is applied. Differentially coupled transistors 12 and 16 and current source 18 comprise an input stage for output gate 10. The base of transistor 16 is coupled to terminal 20. Further, the collectors of transistors 12 and 16 are coupled by resistors 22 and 24, respectively, to a second supply voltage terminal at which the operating potential $V_{CC}$ is applied. P-channel field-effect transistor (FET) 26 has a gate electrode coupled to the collector of transistor 12, a drain electrode coupled to the collector of transistor 16, and a source electrode coupled to operating potential $V_{CC}$. Output transistor 28 has a base coupled to the collector of transistor 16 and a collector coupled to operating potential $V_{CC}$. The emitter of transistor 28 is ocupled to output terminal 30 and to operating potential $V_{TT}$ by resistor 32. A differential logic signal is typically applied to terminals 14 and 20 whereby the non-inverting signal is applied to terminal 14 while the inverting signal is applied to terminal 20. Also, output terminal 30 provides a logic low or a logic high based upon the levels appearing at terminals 14 and 20.

In operation, assume a signal being in a first logic state, for example a logic low, is applied to terminal 14 while a corresponding logic high signal is applied to terminal 20. This will render transistor 16 operative and transistor 12 non-operative and, thus, substantially all the current provided by current source 18 will flow through transistor 16 and resistor 24. A logic low will then be provided at output terminal 30 via the voltage drop across resistor 24 and across the base emitter junction of transistor 28. Or more clearly, the output voltage logic low level ($V_{OL}$) can be calculated as:

$$V_{OL} = V_{CC} - (I_{18} \times R_{24}) - V_{BE(tran.\ 28)} \qquad (1)$$

where ($I_{18} \times R_{24}$) represents the voltage drop across resistor 24 with the current from current source 18 flowing therethrough; and $V_{BE(trans.\ 28)}$ is the voltage across the base-emitter junction of transistor 28.

It should be noted, as seen from Eqn. 1, that the value of resistor 24 is chosen to provide an adequate $V_{OL}$ level.

Further note that P-channel FET 26 is rendered non-operative since its gate electrode is substantially equal to operating potential $V_{CC}$(a logic high).

On the other hand, assume now that a signal being in a second logic state, for example a logic high, is applied to terminal 14 while a corresponding logic low signal is applied to terminal 20. This will render transistor 12 operative and transistor 16 non-operative and substantially all the current provided by current source 18 will flow through transistor 12 and resistor 22. A logic high will then be provided at output terminal 30 since the voltage on the base of transistor 28 is substantially equal to operating potential $V_{CC}$. Therefore, neglecting the base current of transistor 28, the logic high output voltage ($V_{OH}$) at output terminal 30 can be calculated as:

$$V_{OH} = V_{CC} - V_{BE(tran. 28)} \tag{2}$$

where all the terms have been previously defined in Eqn. 1.

However, since output transistor 28 is operative and has current flowing therethrough, it should be known that output transistor 28 has a base current associated therewith. This base current, in the absence of P-channel FET 26, typically flows through resistor 24 thereby lowering the output voltage logic level ($V_{OH}$) at output terminal 30. In addition, if resistor 24 is chosen substantially large in value (so as to minimize the value of current source 18 as well as the power dissipation), the voltage drop occurring across resistor 24, due to the base current of transistor 28, may very well lower the $V_{OH}$ level to a level that is no longer within a predetermined range or specification.

It is important to note that the value of resistor 22 is chosen such that the voltage drop thereacross will provide the proper voltage at the gate electrode of P-channel FET 26 so that P-channel FET 26 is rendered operative as transistor 12 is turned off responsive to a low logic level applied thereto. Therefore, with the addition of P-channel FET 26, the required base current for transistor 28 can now be supplied from P channel FET 26 thereby maintaining substantially zero current flow through resistor 24. Thus, the $V_{OH}$ level is substantially independent of the value of resistor 24 which means that resistor 24 can be made as large as desired provided that it still chosen to provide an adequate $V_{OL}$ level in conjunction with the value of current source 18 as aforedescribed. By utilizing P-channel FET 26, the current provided by current source 18 can be substantially decreased along with the value of resistor 24 being substantially increased while output gate 10 still maintains adequate $V_{OH}$ and $V_{OL}$ levels.

Another equivalent way to understand the operation of output gate 10 is that when P-channel FET 26 is rendered operative, it acts like a resistor in parallel with resistor 24. Further, if the drain-source resistance of P-channel FET 26 is made small and substantially lower than the resistance of resistor 24, the equivalent parallel resistance will be primarily determined by P-channel FET 26 as should be well understood. This will then allow resistor 24 to be substantially increased while still maintaining an adequate $V_{OH}$ level.

Referring to FIG. 2, a detailed schematic diagram illustrating a second embodiment of the output gate of the present invention is shown. It is understood that components similar to those of FIG. 1 are designated by same reference numbers. The output gate of FIG. 2 further comprises P-channel FET 34 having a gate electrode coupled to the collector of transistor 16, a drain electrode coupled to the collector of transistor 12, and a source electrode coupled to operating potential $V_{CC}$. Output transistor 36 has a collector coupled to operating potential $V_{CC}$ and a base coupled to the collector of transistor 12. The emitter of output transistor 36 is coupled to operating potential $V_{TT}$ by resistor 38 and to output terminal 40. The circuit of FIG. 2 illustrates an output gate, similar to output gate 10 of FIG. 1, but having differential outputs as shown at output terminals 30 and 40.

The operation of the circuit of FIG. 2 is very similar to the operation of output gate 10 of FIG. 1. However, resistors 22 and 24 must now be carefully chosen so that the voltage drops thereacross will provide both adequate $V_{OL}$ levels at output terminals 40 and 30, respectively, and the proper voltage levels at the gate electrodes of P-channel FETs 34 and 26, respectively, to render the P-channel FETs operative. Further, the operation of P-channel FET 34, output transistor 36 and resistor 38 is identical to the operation of P-channel FET 26, output transistor 28 and resistor 32, respectively, as described in detail for the circuit of FIG. 1. The output gate 10 of FIG. 1 and, thus, requires additional P-channel FET 34 along with the additional standard driver for ECL outputs comprising output transistor 36 and resistor 38.

The output gate of the present invention has been described primarily for use with ECL circuits. However, the present invention is not intended to be limited to ECL applications and, in fact, can be utilized in all logic circuits by selecting the proper values for resistors 22 and 24 along with proper output drivers. Further, transistors 26 and 34 are not limited to field-effect transistors, but could also include MOSFETs, MESFETs and even static induction transistors (SIT).

By now it should be apparent from the foregoing discussion that a novel output gate has been provided having reduced power dissipation while still providing adequate $V_{OL}$ and $V_{OH}$ output voltage levels.

What is claimed is:

1. A BiMOS output gate, comprising:
    an input stage responsive to logic input signals supplied to first and second inputs for providing output logic signals at first and second outputs;
    a field effect transistor having first and second electrodes and a control electrode, said control electrode being coupled to said first output of said input stage, said first electrode being coupled to said second output of said input stage, and said second electrode being coupled to a first supply voltage terminal;
    a first resistor coupled across said second and control electrodes of said field-effect transistor;
    a second resistor coupled across said first and second electrodes of said field-effect transistor such that when said logic input signal applied to said first input of said input stage is in a first logic state, the voltage drop occurring across said first resistor renders said field-effect transistor operative wherein the effective resistance of said second resistor is decreased; and
    an output stage coupled to said second output of said input stage for providing an output logic signal at an output terminal of the BiMOS output gate responsive to said logic input signals.

2. The BiMOS output gate according to claim 1 wherein said input stage includes:

a first transistor having a collector, a base and an emitter, said collector being coupled to said first output of said input stage, said base being coupled to said first input of said input stage, and said emitter being coupled to a second supply voltage terminal;

a second transistor having a collector, a base and an emitter, said collector being coupled to said second output of said input stage, said base being coupled to second input of said input stage, and said emitter being coupled to said emitter of said first transistor; and a current source coupled between emitters of said first and second transistors and said second supply voltage terminal.

3. The BiMOS output gate according to claim 2 wherein said output stage includes:

a third transistor having a collector, a base and an emitter, said collector being coupled to said first supply voltage terminal, said base being coupled to said second output of said input stage, and said emitter being coupled to an output terminal of the BiMOS output gate and to a third supply voltage terminal; and a third resistor coupled between said emitter of said third transistor and said third supply voltage terminal.

4. A circuit, comprising;

a first transistor having a collector, a base and an emitter, said collector being coupled to a first supply voltage terminal, said base being coupled to a first terminal at which a first signal is applied, and said emitter being coupled to a second supply voltage terminal;

a second transistor having a collector, a base and an emitter, said collector being coupled to said first supply voltage terminal, said base being coupled to a second terminal at which a second signal is applied, and said emitter being coupled to said emitter of said first transistor;

a field effect transistor having first and second electrodes and a control electrode, said control electrode being coupled to said collector of said first transistor, said first electrode being coupled to said collector of said second transistor, and said second electrode being coupled to said first supply voltage terminal;

a first resistor coupled across said second and control electrodes of said field-effect transistor;

a second resistor coupled across said first and second electrodes of said field-effect transistor such that when said first signal is in a first logic state, the voltage drop occurring across said first resistor renders said field-effect transistor operative wherein the effective resistance of said second resistor is decreased; and a current source coupled between said emitters of said first and second transistors and said second supply voltage terminal.

5. A BiMOS output gate, comprising:

a first transistor having a collector, a base and an emitter, said collector being coupled to a first supply voltage terminal, said base being coupled a first terminal, and said emitter being coupled to a second supply voltage terminal;

a second transistor having a collector, a base and an emitter, said collector being coupled to said first supply voltage terminal, said base being coupled to a second terminal, and said emitter being coupled to said emitter of said first transistor;

a field effect transistor having first and second electrodes and a control electrode, said control electrode being coupled to said collector of said first transistor, said first electrode being coupled to said collector of said second transistor, and said second electrode being coupled to said first supply voltage terminal;

a first resistor coupled between said first supply voltage terminal and said collector of said first transistor;

a second resistor coupled between said first supply voltage terminal and said collector of said second transistor; and a current source coupled between emitters of said first and second transistors and said second supply voltage terminal.

6. The circuit according to claim 5 further includes:

a third transistor having a collector, a base and an emitter, said collector being coupled to said first supply voltage terminal, said base being coupled to said collector of said second transistor, and said emitter being coupled to an output terminal and to a third supply voltage terminal; and a third resistor coupled between said emitter of said third transistor and said third supply voltage terminal.

7. The circuit according to claims 6 further includes:

an additional field-effect transistor having first and second electrodes and a control electrode, said control electrode being coupled to said collector of said second transistor, said first electrode being coupled to said collector of said first transistor, and said second electrode being coupled to said first supply voltage terminal.

8. The circuit according to claim 7 further includes:

a fourth transistor having a collector, a base and an emitter, said collector being coupled to said first supply voltage terminal, said base being coupled to said collector of said first transistor, and said emitter being coupled to an additional output terminal and to said third supply voltage terminal; and a fourth resistor being coupled between said emitter of said fourth transistor and said third supply voltage terminal.

9. The circuit according to claim 8 wherein said field-effect and said additional field-effect transistors are P-channel field-effect transistors.

10. A differential output gate, comprising;

a first transistor having a collector, a base and an emitter, said collector being coupled to a first supply voltage terminal, said base being coupled a first terminal, and said emitter being coupled to a second supply voltage terminal;

a second transistor having a collector, a base and an emitter, said collector being coupled to said first supply voltage terminal, said base being coupled to a second terminal, and said emitter being coupled to said emitter of said first transistor;

a first field-effect transistor having first and second electrodes and a control electrode, said control electrode being coupled to said collector of said first transistor, said first electrode being coupled to said collector of said second transistor, and said second electrode being coupled to said first supply voltage terminal;

a second field-effect transistor having first and second electrodes and a control electrode, said control electrode being coupled to said collector of said second transistor, said first electrode being coupled to said collector of said first transistor, and said second electrode being coupled to said first supply voltage terminal a first resistor coupled between said first supply voltage terminal and said collector of said first transistor;

a second resistor coupled between said first supply voltage terminal and said collector of said second transistor; and a current source coupled between said emitters of said first and second transistors and said second supply voltage terminal.

11. The differential output gate according to claim 10 further includes:

a first output transistor having a collector, a base and an emitter, said collector being coupled to said first supply voltage terminal, said base being coupled to said collector of said second transistor, and said emitter being coupled to a first output terminal and to a third supply voltage terminal;

a second output transistor having a collector, a base and an emitter, said collector being coupled to said first supply voltage terminal, said base being coupled to said collector of said first transistor, and said emitter being coupled to a second output terminal and to said third supply voltage terminal;

a third resistor coupled between said emitter of said first output transistor and said third supply voltage terminal; and a fourth resistor being coupled between said emitter of said second output transistor and said third supply voltage terminal.

12. The circuit according to claim 11 wherein said first and second field-effect transistors are P-channel field-effect transistors.

* * * * *

UNITED STATES PATENT AND TRADEMARK OFFICE
CERTIFICATE OF CORRECTION

PATENT NO. : 5,023,479

DATED : June 11, 1991

INVENTOR(S) : Philip A. Jeffery; Bor-Yuan Hwang

It is certified that error appears in the above-identified patent and that said Letters Patent is hereby corrected as shown below:

In column 3, line 38, please delete "off" and insert therefor --on--.

In column 3, line 38, please delete "low" and insert therefor --high--.

In column 3, line 39, please delete "thereto" and insert therefor --to terminal 14--.

Signed and Sealed this

Twenty-fourth Day of November, 1992

*Attest:*

DOUGLAS B. COMER

*Attesting Officer*     *Acting Commissioner of Patents and Trademarks*